US011160185B2

(12) United States Patent
Chen

(10) Patent No.: US 11,160,185 B2
(45) Date of Patent: Oct. 26, 2021

(54) MODULAR HIGH DENSITY COMMUNICATIONS CHASSIS

(71) Applicant: EZCONN CORPORATION, New Taipei (TW)

(72) Inventor: Szu ming Chen, New Taipei (TW)

(73) Assignee: EZconn Corporation, New Taipei (TW)

(*) Notice: Subject to any disclaimer, the term of this patent is extended or adjusted under 35 U.S.C. 154(b) by 0 days.

(21) Appl. No.: 16/889,862

(22) Filed: Jun. 2, 2020

(65) Prior Publication Data

US 2021/0282292 A1    Sep. 9, 2021

(30) Foreign Application Priority Data

Mar. 3, 2020 (TW) ................................ 109202363

(51) Int. Cl.
| | | |
|---|---|---|
| *G06F 1/16* | (2006.01) | |
| *H05K 5/00* | (2006.01) | |
| *H05K 7/00* | (2006.01) | |
| *H05K 7/14* | (2006.01) | |
| *H05K 5/02* | (2006.01) | |

(52) U.S. Cl.
CPC ......... *H05K 7/1491* (2013.01); *H05K 5/0221* (2013.01); *H05K 5/0295* (2013.01); *H05K 7/1405* (2013.01); *H05K 7/1461* (2013.01); *H05K 7/1487* (2013.01)

(58) Field of Classification Search
CPC .. H05K 7/1491; H05K 7/1405; H05K 7/1461; H05K 7/1487; H05K 7/1489; H05K 7/1488; H05K 7/1485; H05K 7/1401; H05K 5/0295; H05K 5/0286; H05K 5/0256; H05K 5/0221; H05K 5/0217
USPC .................................................. 361/725–727
See application file for complete search history.

(56) References Cited

U.S. PATENT DOCUMENTS

| | | | | |
|---|---|---|---|---|
| 6,483,107 | B1 * | 11/2002 | Rabinovitz | G06F 1/181 |
| | | | | 250/239 |
| 9,417,401 | B2 * | 8/2016 | Zhang | G02B 6/4471 |
| 10,222,571 | B2 * | 3/2019 | Solheid | G02B 6/443 |
| 10,715,271 | B1 * | 7/2020 | Cox | H04J 14/02 |
| 2009/0103878 | A1 * | 4/2009 | Zimmel | G02B 6/3897 |
| | | | | 385/135 |
| 2010/0278498 | A1 * | 11/2010 | Zimmel | G02B 6/2938 |
| | | | | 385/135 |

(Continued)

*Primary Examiner* — Anthony M Haughton

(57) ABSTRACT

A modular high density communications chassis, comprising a chassis and slidable carrier module is provided. The chassis comprises a second track having a first and second stage access fixing recess and a sectional sliding mechanism having a moveable squeeze-release latching rail mechanism. The slidable carrier module comprises a push-pull tab and a snap-fit mechanism, and is slidably mounted to the second track and squeeze-release latching rail mechanism. The slidable carrier module is slidably mounted to the chassis vertically. The snap-fit mechanism is configured to secure and release the slidable carrier module in and from a first stage position when corresponding to the first stage access fixing recess, and in and from a second stage position when corresponding to the second stage access fixing recess, via pulling and pushing of the at least a push-pull tab, respectively, providing staged access to the slidable carrier module and staged management of the connector cables extending to and therefrom.

20 Claims, 14 Drawing Sheets

(56) References Cited

U.S. PATENT DOCUMENTS

2020/0108646 A1\* 4/2020 Burke .................... B41J 2/1752

\* cited by examiner

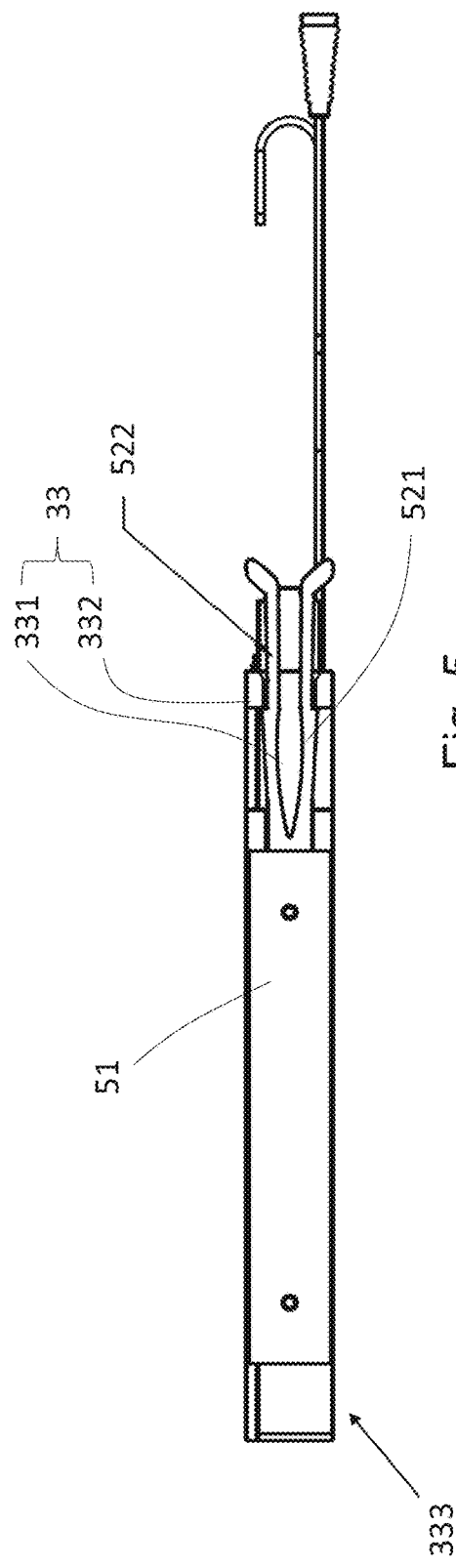
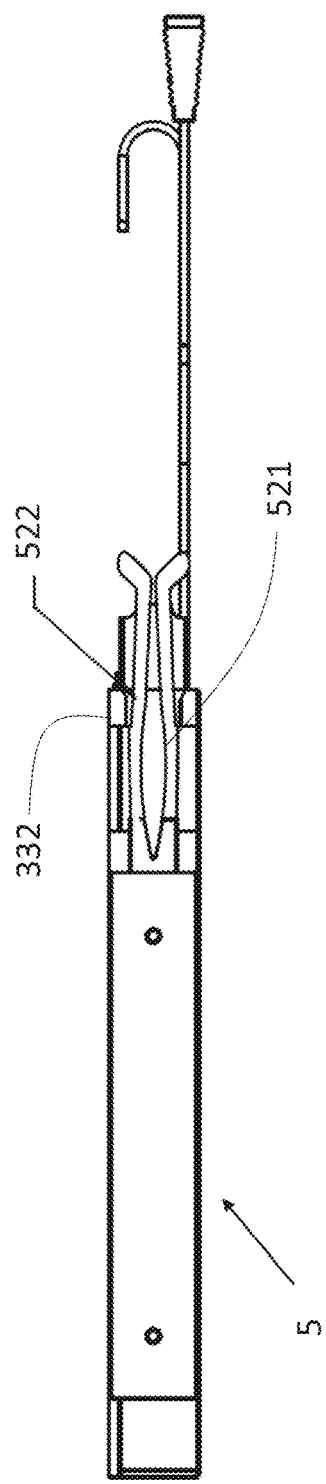
Fig. 5
Fig. 6

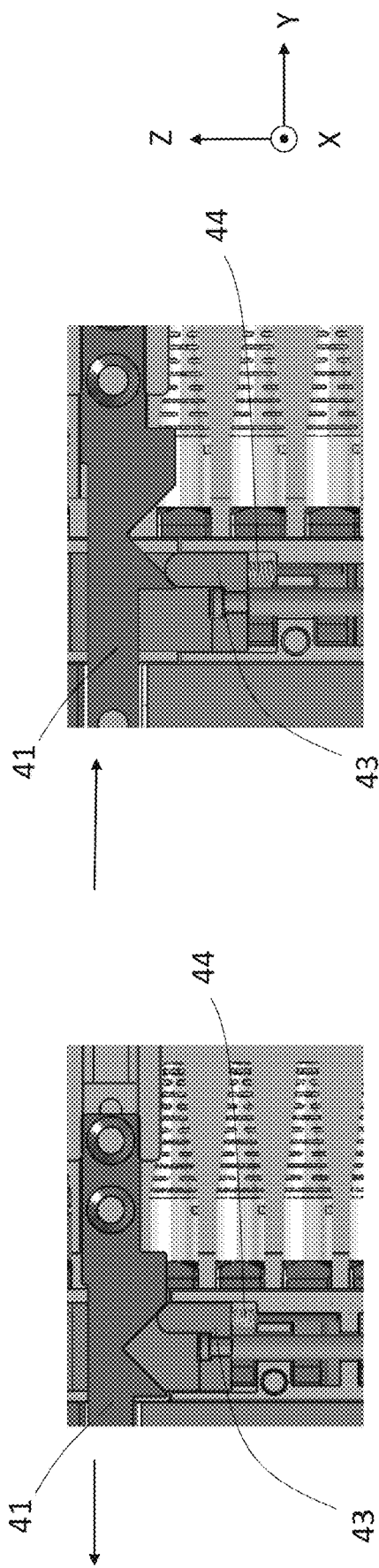

MODULAR HIGH DENSITY COMMUNICATIONS CHASSIS

RELATED APPLICATIONS

The application claims the benefit of priority to Taiwan application no. 109202363, filed on Mar. 3, 2020, of which is incorporated herein by reference in its entirety.

TECHNICAL FIELD

Example embodiments relate generally to the field of communications and, more particularly, to high density mounting arrangements for mounting communications equipment to a chassis, the chassis providing cable management and allowing staged access to the equipment.

BACKGROUND

Driven by the ever-growing computing demands of cloud users, generation of massive amounts of data by edge computing devices such as AI-enabled IoT devices, and roll-out of 5G networks, the architectures of hyperscale, colocation and on-premise data centers have rapidly evolved and new data centers closer to end-users or devices have been built as the demand for services that rely on edge data centers increase.

For data centers, whether it's new builds or network upgrades, proper cabling infrastructure is required for successful application delivery within the data centers. The cabling infrastructure must be reliable, easy to install, modular and flexible, to accommodate changes, and scalable to support data center growth. In general, the cabling infrastructure connects the end and intermediate points of traffic patterns within the data centers to and from routers, interconnection switches, access switches, servers, SAN switches and storage.

For installation of connector cables, pre-connectorized cables may be utilized for snap fit connections to high density communications equipment. Generally, the connectors comprise of cables, a connector body, and a coupling device, and the high density communications equipment comprises of racks or frames, chassis', carrier modules and cable management features.

With new data centers being built and existing data centers being upgraded the problem of poor communications equipment access and cable management during installation, maintenance and repair have increased. Often, there are multiple adapters and cable segments connected in a data center, with access to connectors used required not just when deployed, but, several times during deployment. Access and cable management during installation, maintenance and repair of communications equipment may be time-consuming, increase the risk of human error, and in some instances, require special tools for completion. Further, densely packed connections may exacerbate the problems and result in damaged communications equipment or devices, or signals not being transmitted.

SUMMARY

Modular high density communications chassis', communications systems, and cable management features for accessing communications equipment and managing cables extending to and/or from the communications equipment in stages are provided.

In an embodiment, a modular high density communications chassis comprising a chassis configured for receiving communications equipment and at least a slidable carrier module is provided. The chassis is defined by a first panel, a second panel, and two opposing side panels, forming an access opening and an access mounting opening, opposite the access opening. At least a second track is positioned on the second panel longitudinal to the two opposing side panels, wherein the at least a second track has a first stage access fixing recess and a second stage access fixing recess. The second stage access fixing recess is closer to the access opening than the first stage access fixing recess.

The at least a slidable carrier module comprises a second module rail on a top side thereof, at least a push-pull tab, and a snap-fit mechanism. The at least a push-pull tab has an extension portion and an assembly portion. The extension portion extends perpendicularly outwardly from a front plane of the at least a slidable carrier module. The assembly portion is assembled to a side of the at least a slidable carrier module. The snap-fit mechanism, corresponding to the assembly portion, is assembled to the side of the at least a slidable carrier module.

The at least a slidable carrier module is slidably mounted on the at least a second track via the second module rail, and when the at least a slidable carrier module is mounted to the chassis, at least a portion of the extension portion of the push-pull tab extends past a plane of the access opening.

The at least a push-pull tab is configured to move the snap-fit mechanism, and the snap-fit mechanism is configured to secure and release the at least a slidable carrier module in and from a first stage position when corresponding to the first stage access fixing recess, and in and from a second stage position when corresponding to the second stage access fixing recess, via pulling and pushing of the at least a push-pull tab, respectively.

In some embodiments, the chassis further comprises at least a sectional sliding mechanism therein. The at least a sectional sliding mechanism, comprises a first track and a squeeze-release latching rail mechanism. The first track is positioned on the first panel longitudinal to the two opposing side panels, opposite and corresponding to the at least a second track. The squeeze-release latching, rail mechanism is slidable relative to the first track, having a squeeze-release portion, configured to secure and release a first module track on a bottom side of the at least a slidable carrier module thereto and therefrom. When the at least a slidable carrier module is mounted to the chassis, the squeeze-release portion extends past a front plane of the at least a slidable carrier module.

The first module track comprises a latch receiving portion on a front end thereof, having a front module portion and two module latching shoulders on the front end. The latch receiving portion is slidably mounted and secured to the squeeze-release latching rail mechanism.

The squeeze-release latching rail mechanism further comprises a latching portion integrated next to the squeeze-release portion, having two corresponding side overhangs. When the latch receiving portion is slidably mounted and secured to the squeeze-release latching rail mechanism, the latching portion is within the front module portion and the two overhangs rest on the two module latching shoulders. When releasing the first module track from the squeeze-release latching rail mechanism, the squeeze-release portion is squeezed together to move the two overhangs of the latching portion toward each other at a distance greater than a depth of the two module latching shoulders, and then pulled outwardly away from within the front module portion.

In some embodiments, the at least a push-pull tab comprises an inverted V-cut-out near to an opposite end of the at least a portion of the push-pull tab extending past the plane of the opening, at a first side thereof, and is moveable to a securing position and two releasing positions on opposite sides of the securing position, relative to the at least a slidable carrier module.

The snap-fit mechanism comprises a snap-fit rod, at least a snap-fit rod member, and a spring member. The snap-fit rod has a protruding end and at least one rod assembly portion, moveably secured and released in and from the first stage access fixing recess and second stage access fixing recess via the protruding end, respectively. The at least a snap-fit rod member is integrally formed on the at least one rod assembly portion having a pressure end and a contact end, opposite the pressure end. The spring member is in constant contact with the pressure end of the at least a snap-fit rod member. When the at least a push-pull tab is in the securing position, the contact end of the at least a snap-fit rod member is in contact with an inner recess of the inverted V-cut-out and when the at least a push-pull tab is in the releasing positions, the contact end of the at least a snap-fit rod member is in contact with either ends of the inverted V-cut-out.

In some embodiments, the extension portion of the push-pull tab comprises a cable hook clip configured for cable management, whereby cables are extended therethrough.

In some embodiments, the extension portion of the push-pull tab comprises a cable hook clip configured for cable management, whereby cables are extended therethrough, and the amount of the at least a push-pull tab is two, and the two at least a push-pull tabs is configured such that the cables extending through the cable hook clips, respectively, is taut.

In some embodiments, the at least a slidable carrier module further comprises at least a connector adapter mounted therein. When the at least a slidable carrier module is mounted to the chassis, at least a connector is mounted to the at least a connector adapter from the access opening and at least a connector is mounted to the at least a connector adapter from the access mounting opening. In some embodiments, the amount of the at least a slidable carrier module is two or greater. In some embodiments, the amount of the at least a connector mounted to the at least a connector adapter is eighteen and the amount of the at least a slidable carrier module is twenty four. In some embodiments, the at least a connector adapter is configured to receive the at least a connector in two positions, whereby each position is different by 180 degrees. In some embodiments, the amount of the at least a connector mounted to the at least a connector adapter configured to receive the at least a connector in two positions is eighteen and the amount of the at least a slidable carrier module is twenty four.

In some embodiments, the chassis further comprises at least a cable clip assembled at the access opening, configured for cable management, whereby the connector cables are extended therethrough, and wherein the connector cables mounted to the at least a connector adapter of each of the neighboring at least a slidable carrier module are staggeredly mounted, and wherein the staggeredly mounted at least a connector mounted to the at least a connector adapter of each of the neighboring at least a slidable carrier module is gathered to flow in opposing directions via the at least a cable clip and cable hook clips.

In some embodiments, the chassis further comprises a pull-out cable management tray assembled to the two opposing side panels of the chassis at the access mounting opening. The pull-out cable management tray is longitudinally moveable relative to the chassis and has at least one tray cable clip assembled thereto, configured for cable management, and a stored position and a cable management position. The connector cables are extended through the at least one tray cable clip. When in the stored position, the pull-out cable management tray is parallel to the first panel, flush therewith, and the connector cables are arranged such that a first protruding arch-shape is formed by portions of the connector cables extending from at least a second panel cable clip assembled to the second panel at the access mounting opening to the at least one tray cable clip. When in the cable management position, the pull-out cable management tray is perpendicular to the first panel, hanging out therefrom, and the cables are stretched such that a smaller portion of the cables is available to form the first protruding arch-shape, forming a smaller second protruding arch-shape and the remaining, portions of the cables are stretched taut, increasing the spacing between the cables.

The at least a slidable carrier module is slidably mounted to the chassis vertically, longitudinal to the two opposing side panels.

In some embodiments, the chassis further comprises at least one supporting structure, slidably mounted therein, in contact with the first and second panels and parallel to the two opposing side panels.

BRIEF DESCRIPTION OF THE DRAWINGS

Unless specified otherwise, the accompanying drawings illustrate aspects of the innovative subject matter described herein. Referring to the drawings, wherein like reference numerals indicate similar parts throughout the several views, several examples of modular high density communications chassis' incorporating aspects of the presently disclosed principles are illustrated by way of example, and not by way of limitation.

FIG. 5 is a schematic perspective bottom view of a slidable carrier module secured to a squeeze-release latching rail mechanism of the chassis of FIG. 1, according to an example embodiment.

FIG. 6 is a schematic perspective bottom view of the slidable carrier module ready for release from the squeeze-release latching rail mechanism of the chassis of FIG. 5, according to an example embodiment.

FIG. 12 is a perspective enlarged view of sectional view B of FIG. 11, whereby the snap-fit rod member is in contact with an end of the inverted V-cut-out of the push-pull tab, according to an example embodiment.

FIG. 13 is a perspective enlarged view of sectional view B of FIG. 11, whereby the snap-fit rod member is in contact with an opposite end of the inverted V-cut-out of the push-pull tab, according to an example embodiment.

DETAILED DESCRIPTION

Figure 1:
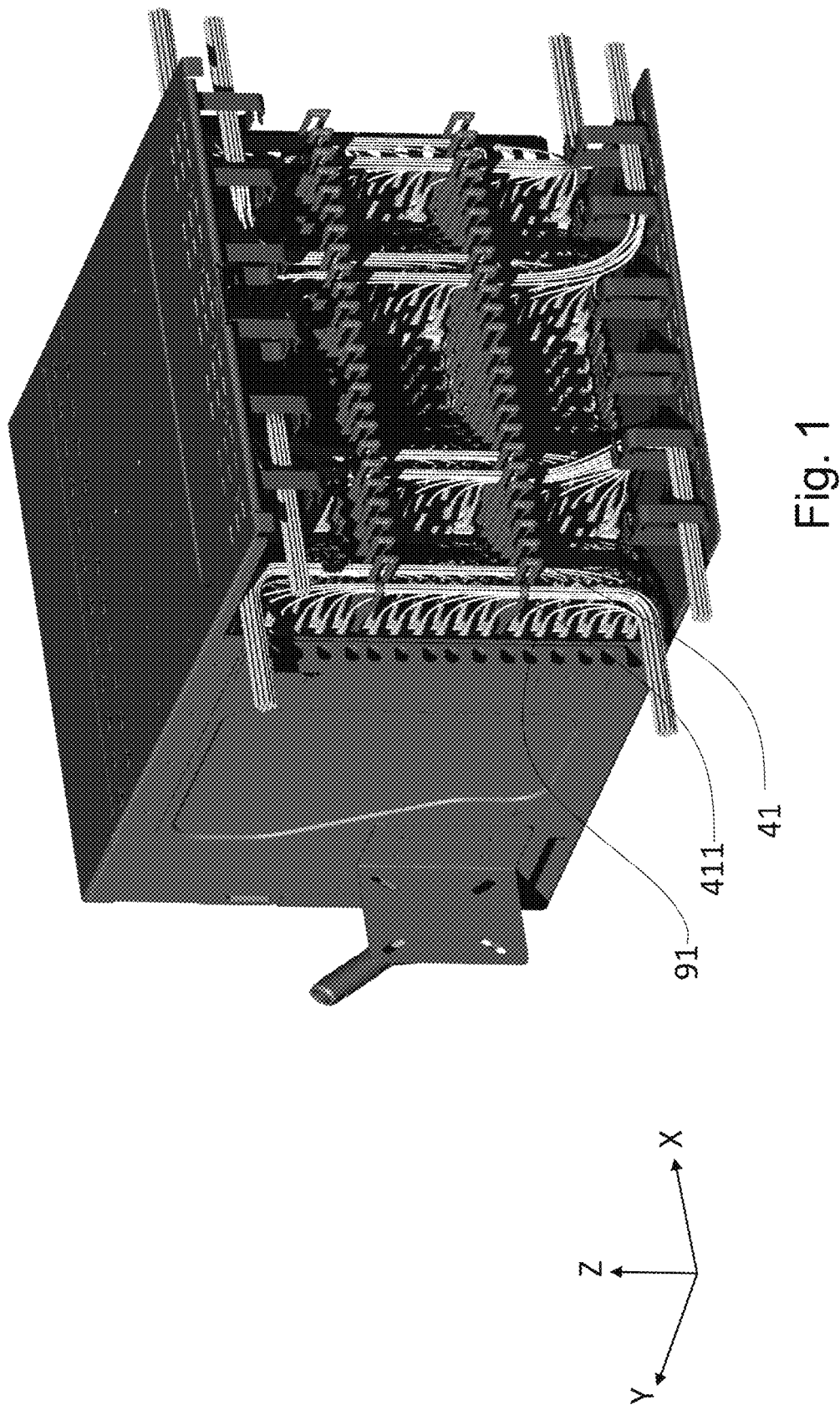
FIG. 1 is a perspective first view of a modular high density communications chassis, according to an example embodiment.

The following describes various principles related to communication systems by way of reference to specific examples of cabling infrastructure, including arrangements and examples of connectors and adapters embodying innovative concepts. More particularly, but not exclusively, such innovative principles are described in relation to selected examples of chassis, carrier modules, and cable hooks or rings, and well-known functions or constructions are be described in detail for purposes of succinctness and clarity. Nonetheless, one or more of the disclosed principles can be incorporated in various other embodiments of chassis, carrier modules, and cable hooks or rings to achieve any of a variety of desired outcomes, characteristics, and/or performance criteria.

Thus, chassis, carrier modules, and cable hooks or rings having attributes that are different from those specific examples discussed herein can embody one or more of the innovative principles, and can be used in applications not described herein in detail. Accordingly, embodiments of chassis, carrier modules, and cable hooks or rings not described herein in detail also fall within the scope of this disclosure, as will be appreciated by those having ordinary skill in the relevant art following a review of this disclosure.

Example embodiments as disclosed herein are directed to modular high density communications chassis. In an embodiment, a modular high density communications chassis, comprising a chassis and slidable carrier module. The chassis comprises a second track having a first and second stage access fixing recess and a sectional sliding mechanism having a moveable squeeze-release latching rail mechanism. The slidable carrier module comprises a push-pull tab and a snap-fit mechanism, and is slidably mounted to the second track and squeeze-release latching rail mechanism. The slidable carrier module is slidably mounted to the chassis vertically. The snap-fit mechanism is configured to secure and release the slidable carrier module in and from a first stage position when corresponding to the first stage access fixing recess, and in and from a second stage position when corresponding to the second stage access fixing recess, via pulling and pushing of the at least a push-pull tab, respectively, providing staged access to the slidable carrier module and staged management of the connector cables extending to and therefrom.

In some embodiments the modular high density communications chassis may be applicable to, as an example and not to be limiting, communications equipment and patch panels, providing physical connection to networks and devices. The connector types of the modular high density communications chassis of the embodiments may be any suitable connector type known to those having ordinary skill in the relevant art. Those having ordinary skill in the relevant art may also readily appreciate, that the modular high density communications chassis of the embodiments may be stackable vertically, horizontally, or both, and secured by any bracket means known by those skilled in the relevant art or within a rack or frame of communications equipment or panels, and the embodiments are not limited thereto.

Generally, the connectors of the embodiments may be used by commercial businesses, governments, and data centers, transmitting gigabit Ethernet and video multimedia, as an example, and is not limited to any particular type of connector.

The modular high density communications chassis of the embodiments may be separately and/or integrally formed and made of any suitable material known to those having ordinary skill in the relevant art.

Figure 2:
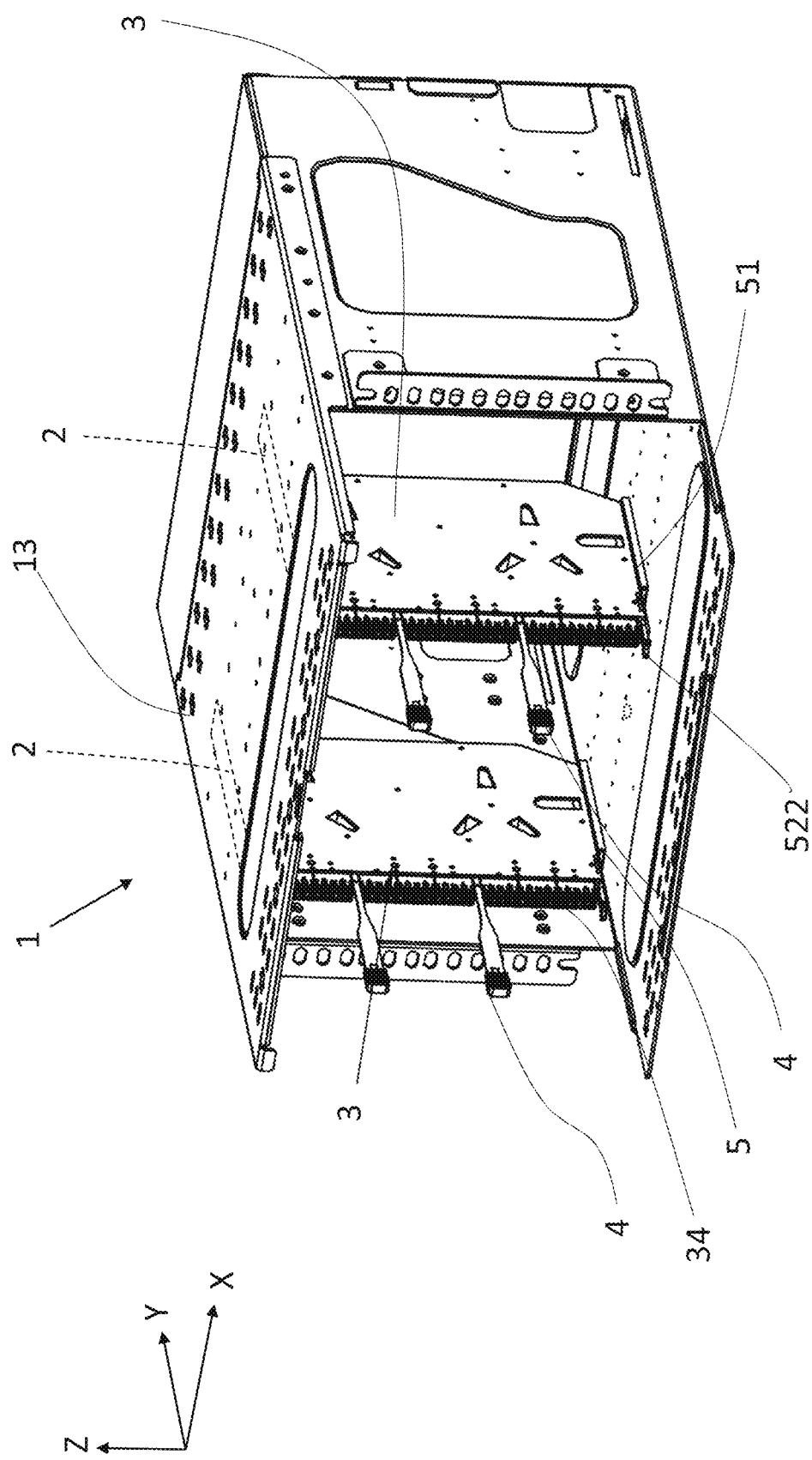
FIG. 2 is a schematic perspective second view of a chassis of the modular high density communications chassis of FIG. 1 having two slidable carrier modules mounted therein, according town example embodiment.
Figure 3:
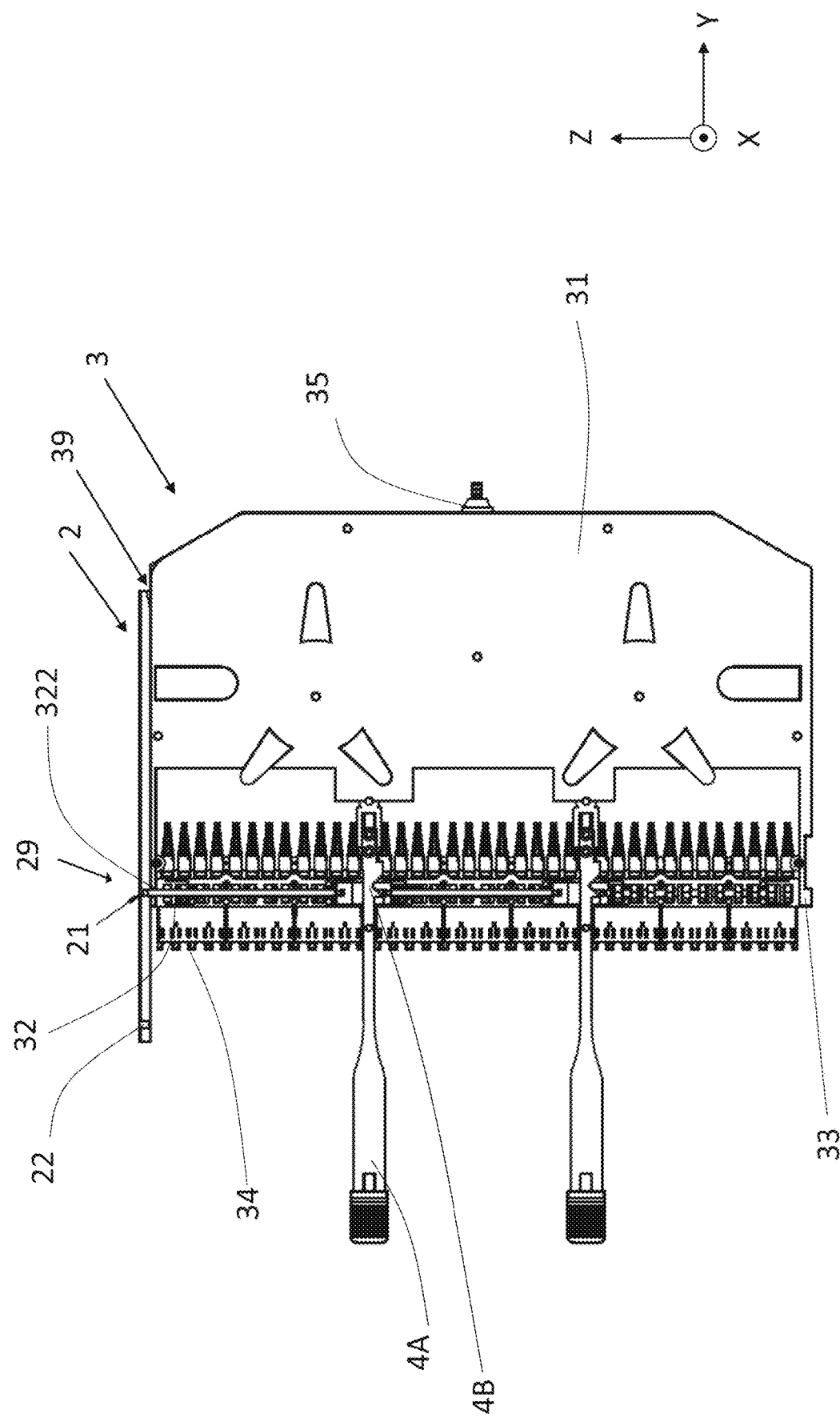
FIG. 3 is a schematic perspective fourth view of a slidable carrier module of FIG. 1, according to an example embodiment.

FIG. 1 is a perspective first view of a modular high density communications chassis, according to an example embodiment. FIG. 2 is a schematic perspective second view of a chassis of the modular high density communications chassis of FIG. 1 having two slidable carrier modules mounted therein, according to an example embodiment. FIG. 3 is a schematic perspective fourth view of a slidable carrier module of FIG. 1, according to an example embodiment. Referring to FIGS. 1 to 3, in an embodiment, a modular high density communications chassis comprises a chassis 1 configured for receiving communications equipment and at least a slidable carrier module 3. The chassis 1 is defined by a first panel 14, a second panel 13, and two opposing side panels 19, 19, forming an access opening 11 and an access mounting opening 12, opposite the access opening 11. At least a second track 2 is positioned on the second panel 13 longitudinal to the two opposing side panels 19, 19, wherein the at least a second track 2 has a first stage access fixing recess 21 and a second stage access fixing recess 22. The second stage access fixing recess 22 is closer to the access opening 11 than the first stage access fixing recess 21.

The at least a slidable carrier module 3 comprising a module body 31 having a front mounting opening 32, a front port end 34, and a rear port end 35. The at least a slidable carrier module 3 further comprises a second module rail 39 on a top side of the module body 31, at least a push-pull tab 4, and a snap-fit mechanism 29. The at least a push-pull tab 4 has an extension portion 4A and an assembly portion 4B. The extension portion 4A extends perpendicularly outwardly from a front plane of the at least a slidable carrier module 3. The assembly portion 4B is assembled to a side of the at least a slidable carrier module 3. The snap-fit mechanism 29, corresponding to the assembly portion 4B, is assembled to the side of the at least a slidable carrier module 3.

The at least a slidable carrier module 3 is slidably mounted on the at least a second track 2 via the second module rail 39, and when the at least a slidable carrier module 3 is mounted to the chassis 1, at least a portion of the extension portion 4A of the push-pull tab 4 extends past a plane of the access opening 11.

The at least a push-pull tab 4 is configured to move the snap-fit mechanism 29, and the snap-fit mechanism 29 is configured to secure and release the at least a slidable carrier module 3 in and from a first stage position when corresponding to the first stage access fixing recess 21, and in and from a second stage position when corresponding to the second stage access fixing recess 22, via pulling and pushing of the at least a push-pull tab 4, respectively.

Figure 4:
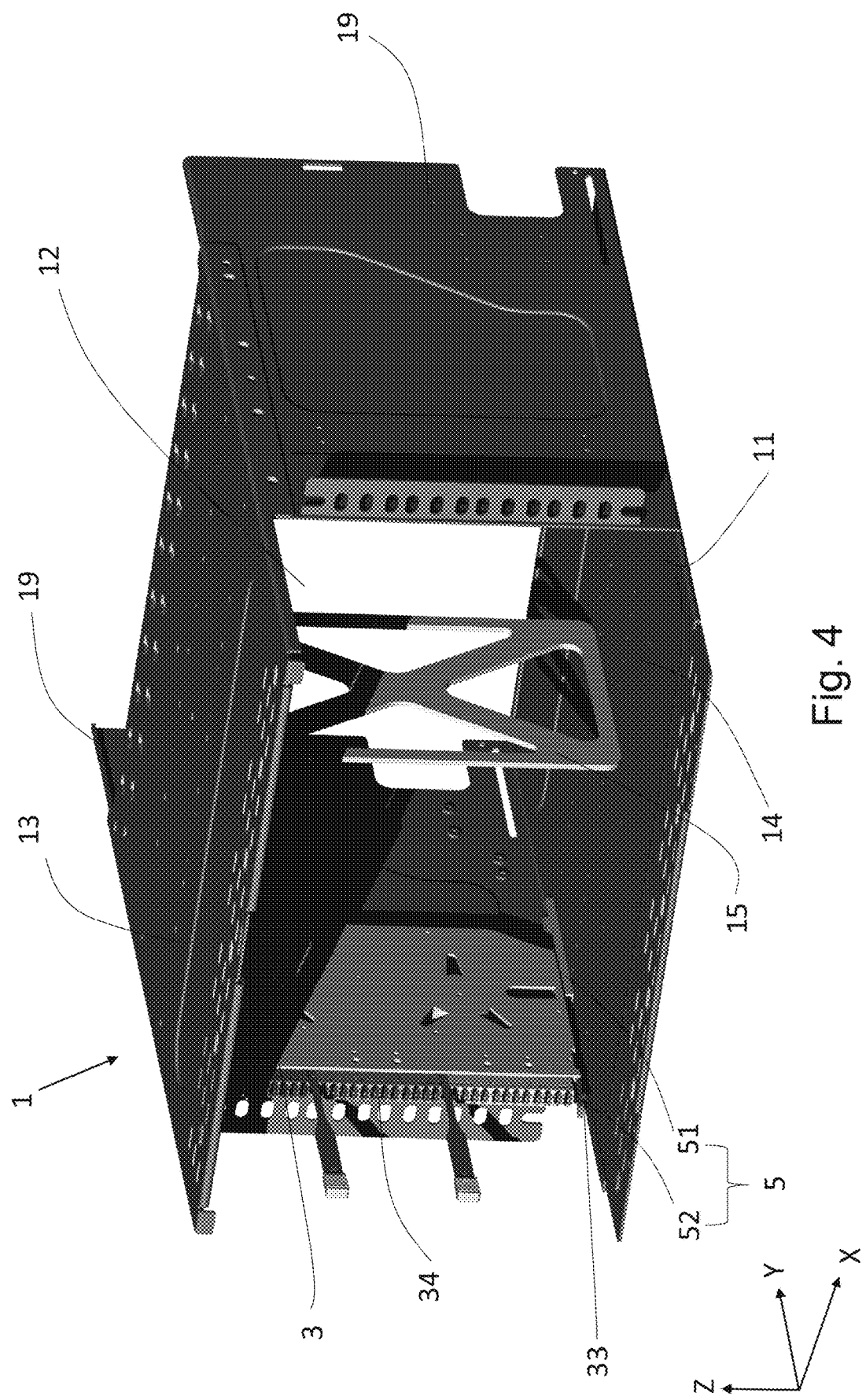
FIG. 4 is a perspective second view of the chassis of the modular high density communications chassis of FIG. 1 having one slidable carrier module and one supporting structure mounted therein, according to an example embodiment.

The at least a slidable carrier module 3 is slidably mounted to the chassis 1 vertically, longitudinal to the two opposing side panels 19, 19. The vertical alignment provides more convenient and less cluttered access to connectors, adapters, and the at least a slidable carrier module 3 as opposed to being horizontal. For horizontal alignment, connectors closer to ground are often covered by connectors further away from ground, providing difficult access. In some embodiments, the amount of the at least a slidable carrier module 3 is one; however, the embodiments are not limited thereto. FIG. 4 is a perspective second view of the chassis of the modular high density communications chassis of FIG. 1 having one slidable carrier module and one supporting structure mounted therein, according to an example embodiment. Referring to FIG. 4, and referring to FIGS. 1 to 3, in some embodiments the chassis 1 further comprises at least one supporting structure 15, slidably mounted therein, in contact with the first and second panels 14, 13 and parallel to the two opposing side panels 19, 19. In some embodiments, the amount of the at least a slidable carrier module 3 is two or greater.

Figure 7:
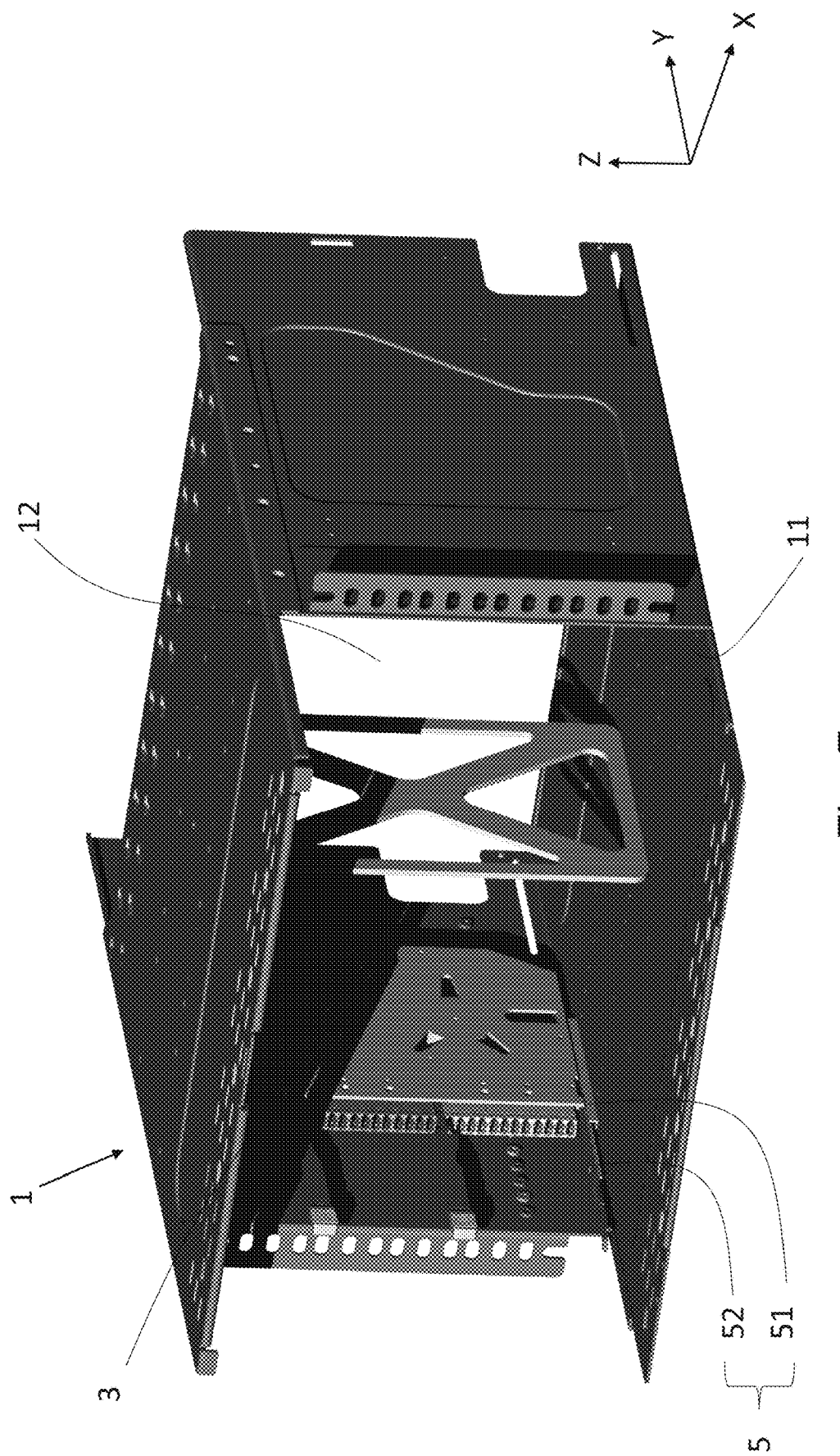
FIG. 7 is a perspective second view of the chassis of the modular high density communications chassis of FIG. 4 having one slidable carrier module released from a squeeze-release latching rail mechanism and one supporting structure mounted therein, according to an example embodiment.
Figure 8:
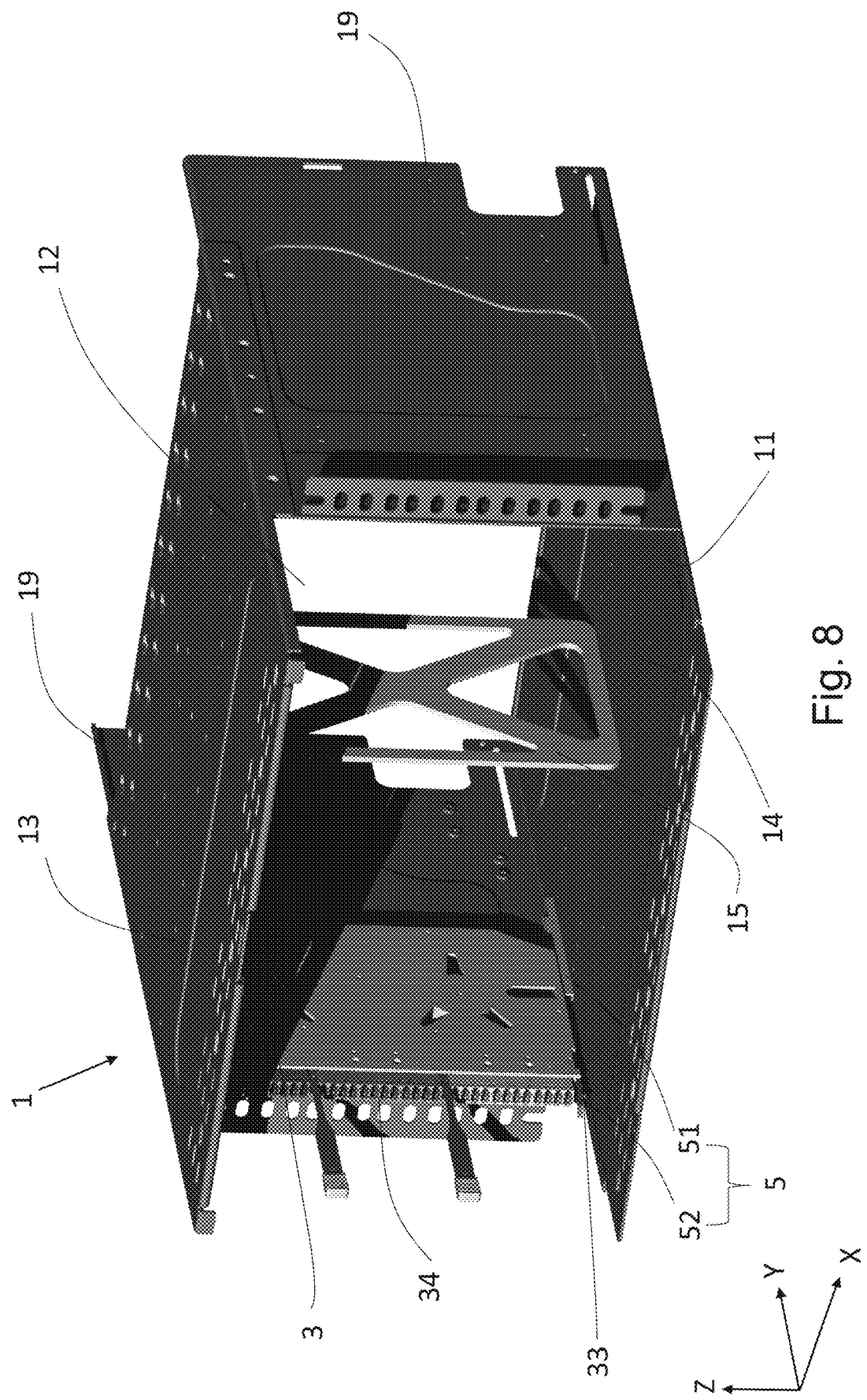
FIG. 8 is a perspective second view of the chassis of the modular high density communications chassis of FIG. 7 having one slidable carrier module mounted to a squeeze-release latching rail mechanism and one supporting structure mounted therein, according to an example embodiment.

In some embodiments, the chassis 1 further comprises at least a sectional sliding mechanism 5 therein. FIG. 5 is a schematic perspective bottom view of a slidable carrier module secured to a squeeze-release latching rail mechanism of the chassis of FIG. 1, according to an example embodiment. FIG. 6 is a schematic perspective bottom view of the slidable carrier module ready for release from the squeeze-release latching rail mechanism of the chassis of FIG. 5, according to an example embodiment. FIG. 7 is a perspective second view of the chassis of the modular high density communications chassis of FIG. 4 having one slidable carrier module released from a squeeze-release latching rail mechanism and one supporting structure mounted therein, according to an example embodiment. FIG. 8 is a perspective second view of the chassis of the modular high density communications chassis of FIG. 7 having one slidable carrier module mounted to a squeeze-release latching rail mechanism and one supporting structure mounted therein, according to an example embodiment. Referring to FIGS. 5 to 8, and referring to FIGS. 1 to 4, the at least a sectional sliding mechanism 5, comprises a first track 51 and a squeeze-release latching rail mechanism 52. The first track 51 is positioned on the first panel 14 longitudinal to the two opposing side panels 19, 19, opposite and corresponding to the at least a second track 2. The squeeze-release latching rail mechanism 52 is slidable relative to the first track 51, having a squeeze-release portion 522, configured to secure and release a first module track 333 on a bottom side of the at least a slidable carrier module 3 thereto. When the at least a slidable carrier module 3 is mounted to the chassis 1, the squeeze-release portion 522 extends past a front plane of the at least a slidable carrier module 3.

The first module track 333 comprises a latch receiving portion 33 on a front end thereof, having a front module portion 331 and two module latching shoulders 332 on the front end. The latch receiving portion 33 is slidably mounted and secured to the squeeze-release latching rail mechanism 52.

The squeeze-release latching rail mechanism 52 further comprises a latching portion 521 integrated next to the squeeze-release portion 522, having two corresponding side overhangs. When the latch receiving portion 33 is slidably mounted and secured to the squeeze-release latching rail mechanism 52, the latching portion 521 is within the front module portion 331 and the two overhangs rest on the two module latching shoulders 332. When releasing the first module track 333 from the squeeze-release latching rail mechanism 52, the squeeze-release portion 522 is squeezed together to move the two overhangs of the latching portion 521 toward each other at a distance greater than a depth of the two module latching shoulders 332, and then pulled outwardly away from within the front module portion 331.

Figure 9:
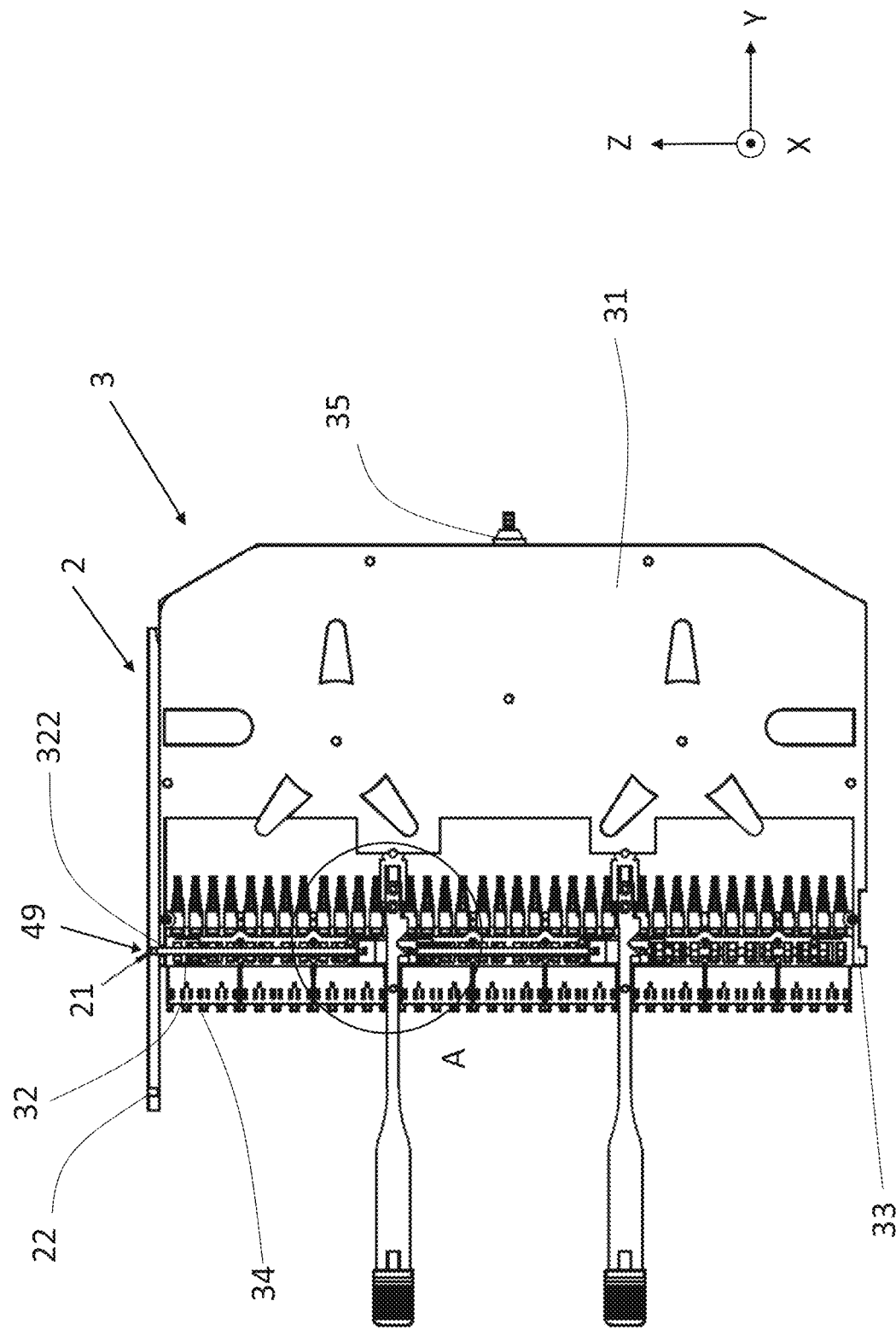
FIG. 9 is a schematic perspective fourth view of a slidable carrier module of FIG. 1 having sectional view A, whereby a snap-fit rod member is in contact with an inner recess of an inverted V-cut-out of a push-pull tab, according to an example embodiment.
Figure 10:
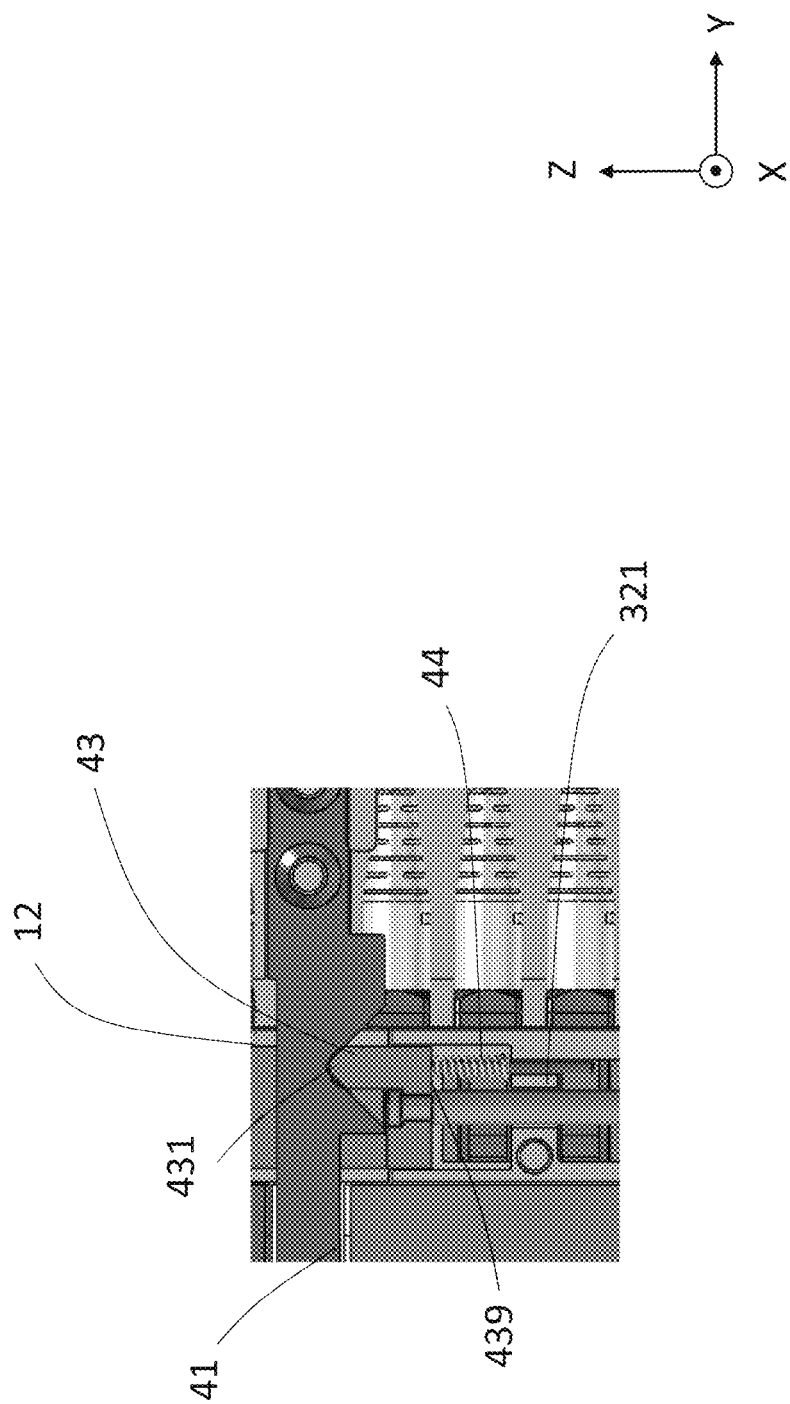
FIG. 10 is a perspective enlarged view of sectional view A of FIG. 9, whereby a snap-fit rod member is in contact with an inner recess of an inverted V-cut-out of a push-pull tab, according to an example embodiment.
Figure 11:
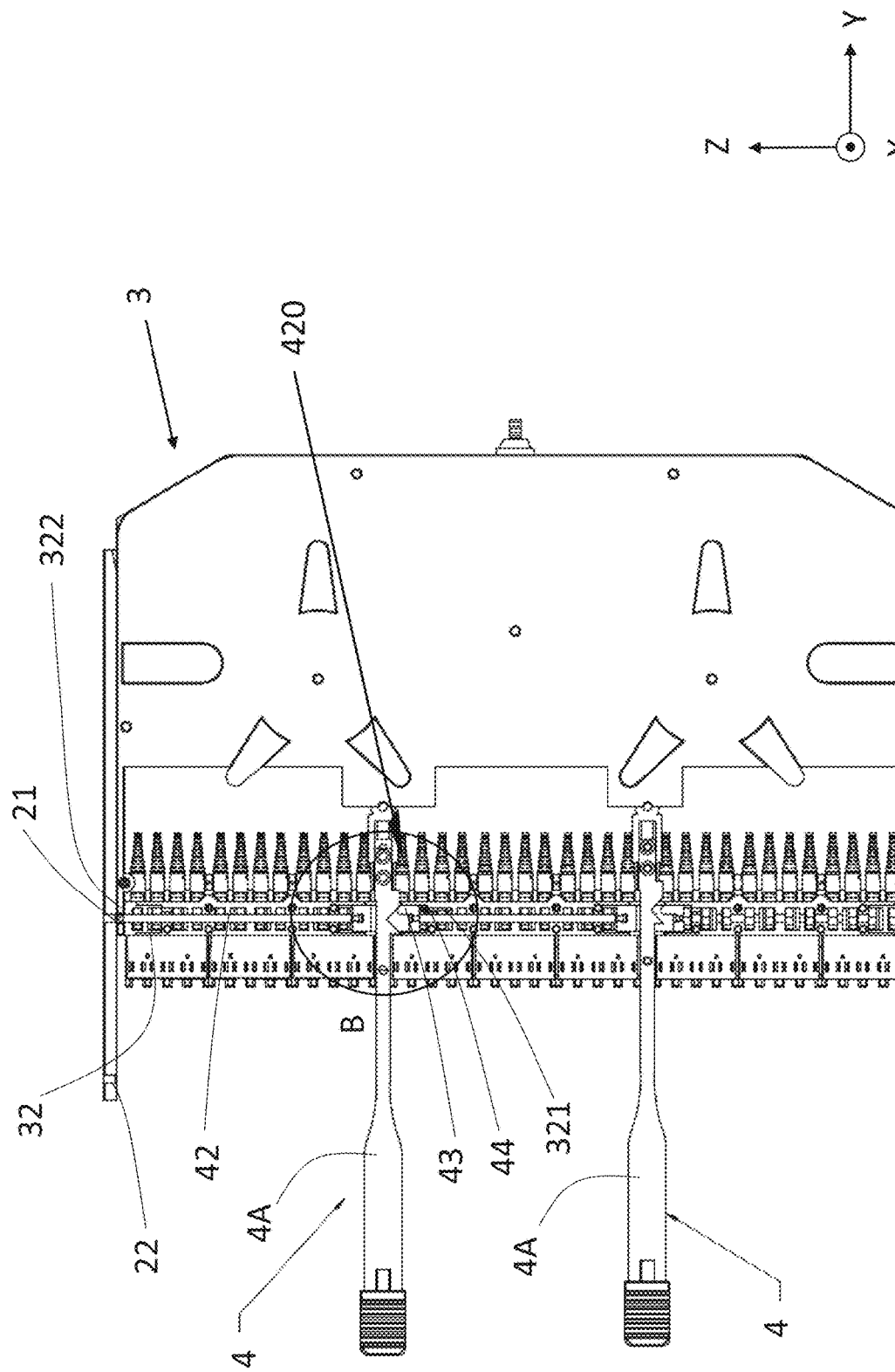
FIG. 11 is a schematic perspective fourth view of the slidable carrier module of FIG. 9 having sectional view B, whereby the snap-fit rod member is in contact with an end of the inverted V-cut-out of the push-pull tab, according to an example embodiment.

The at least a push-pull tab 4 is configured to move the snap-fit mechanism 29, and the snap-fit mechanism 29 is configured to secure and release the at least a slidable carrier module 3 in and from a first stage position when corresponding to the first stage access fixing recess 21, and in and from a second stage position when corresponding to the second stage access fixing recess 22, via pulling and pushing of the at least a push-pull tab 4, respectively. FIG. 9 is a schematic perspective fourth view of a slidable carrier module of FIG. 1 having sectional view A, whereby a snap-fit rod member is in contact with an inner recess of an inverted V-cut-out of a push-pull tab, according to an example embodiment. FIG. 10 is a perspective enlarged view of sectional view A of FIG. 9, whereby a snap-fit rod member is in contact with an inner recess of an inverted V-cut-out of a push-pull tab, according to an example embodiment. FIG. 11 is a schematic perspective fourth view of the slidable carrier module of FIG. 9 having sectional view B, whereby the snap-fit rod member is in contact with an end of the inverted V-cut-out of the push-pull tab, according to an example embodiment. FIG. 12 is a perspective enlarged view of sectional view B of FIG. 11, whereby the snap-fit rod member is in contact with an end of the inverted V-cut-out of the push-pull tab, according to an example embodiment. FIG. 13 is a perspective enlarged view of sectional view B of FIG. 11, whereby the snap-fit rod member is in contact with an opposite end of the inverted V-cut-out of the push-pull tab, according to an example embodiment. Referring to FIGS. 9 to 13, and referring to FIGS. 1 to 8, in some embodiments, the at least a push-pull tab 4 comprises an inverted V-cut-out near to an opposite end of the at least a portion of the push-pull tab 4 extending past the plane of the opening, at a first side thereof, and is moveable to a securing position and two releasing positions on opposite sides of the securing position, relative to the at least a slidable carrier module 3.

The snap-fit mechanism 29 comprises a snap-fit rod 42, at least a snap-fit rod member 43, and a spring member 44. The snap-fit rod 42 has a protruding end 49 and at least one rod assembly portion 420, moveably secured and released in and from the first stage access fixing recess 21 and second stage access fixing recess 22 via the protruding end 49, respectively. The at least a snap-fit rod member 43 is integrally formed on the at least one rod assembly portion 420 having a pressure end 439 and a contact end 431, opposite the pressure end 439. The spring member 44 is in constant contact with the pressure end 439 of the at least a snap-fit rod member 43. When the at least a push-pull tab 4 is in the securing position, the contact end 431 of the at least a snap-fit rod member 43 is in contact with an inner recess of the inverted V-cut-out and when the at least a push-pull tab 4 is in the releasing positions, the contact end 431 of the at least a snap-fit rod member 43 is in contact with either ends of the inverted V-cut-out.

In some embodiments, the at least a slidable carrier module 3 further comprises at least a passageway, for smooth and stable movement of the snap-fit rod 42. For example, passageway 322 may be a hole to allow smooth and stable movement of the protruding end 49 of the snap-fit rod 42 therethrough; however, the embodiments are not limited thereto. In the embodiments, the passageway may be any number of and suitable passageways known to those having ordinary skill in the relevant art. As long as the snap-fit mechanism 29 is configured to secure and release the slidable carrier module 3 in and from a first stage position when corresponding to the first stage access fixing recess 21, and in and from a second stage position when corresponding to the second stage access fixing recess 22, via pulling and pushing of the at least a push-pull tab 4, respectively, providing staged access to the slidable carrier module 3 and staged management of the connector cables extending to and therefrom.

In some embodiments, the at least a slidable carrier module 3 further comprises at least a spring supporting structure 321, at least partially supporting compression of the spring member 44 when the at least a push-pull tab 4 is in the releasing positions, such that the contact end of the at least a snap-fit rod member 43 is in contact with either ends of the inverted V-cut-out of the at least a push-pull tab 4.

Figure 14:
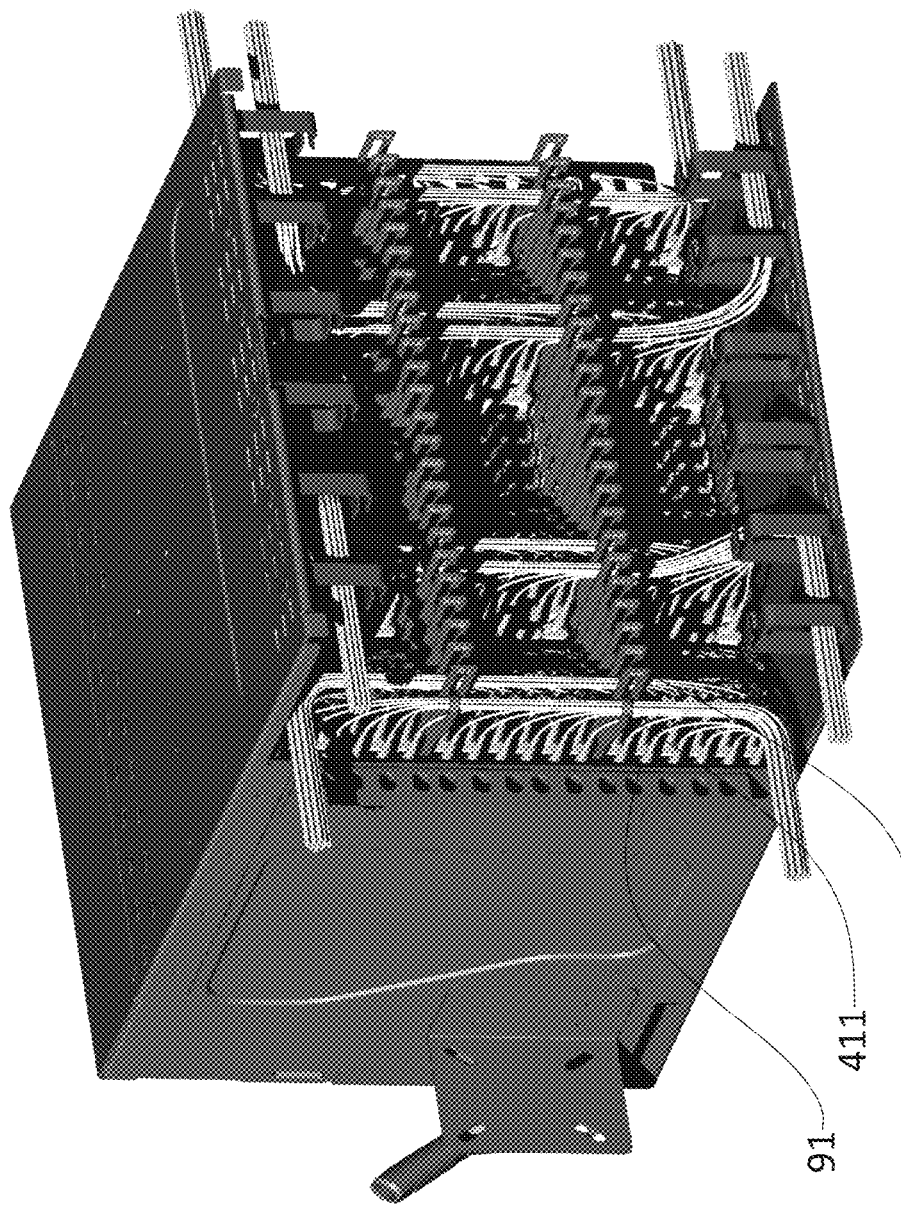
FIG. 14 is a perspective first view of a modular high density communications chassis of FIG. 1 having a cable management set-up, according to an example embodiment.
Figure 15:
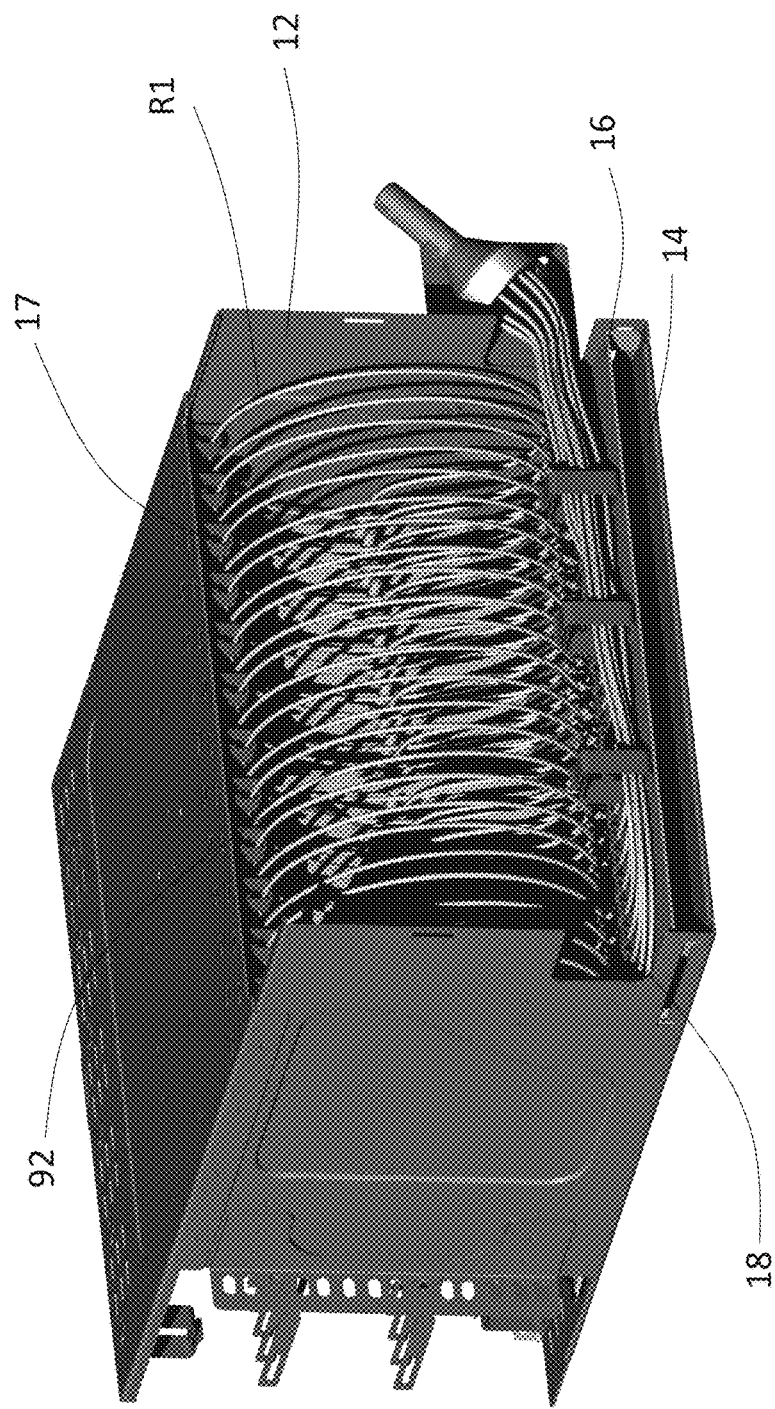
FIG. 15 is a perspective third view of the modular high density communications chassis of FIG. 1 having a pull-out cable management tray in a stored position, according to an example embodiment.
Figure 16:
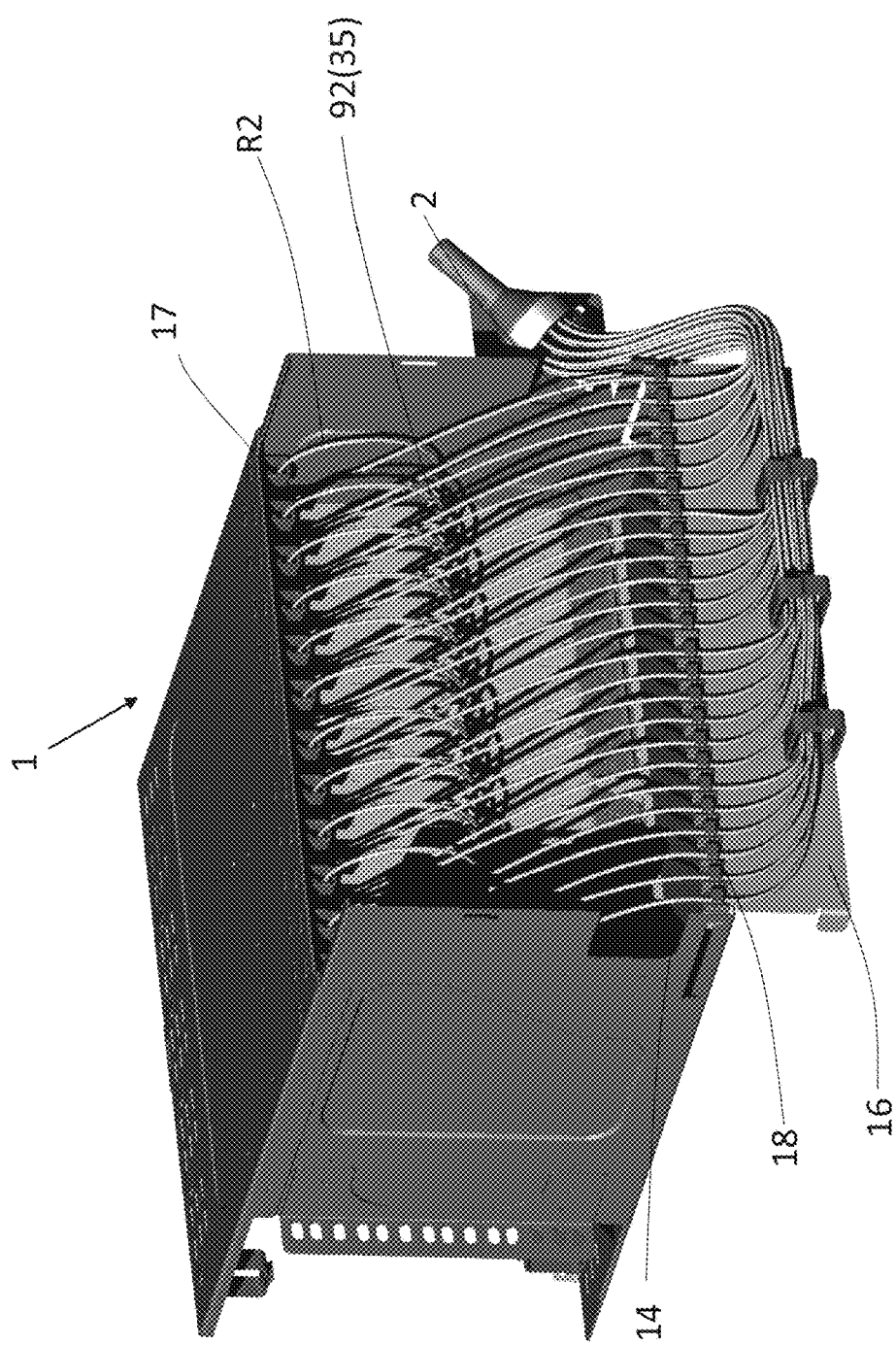
FIG. 16 is a perspective third view of the modular high density communications chassis of FIG. 15 having a pull-out cable management tray in a cable management position, according to an example embodiment.

FIG. 14 is a perspective first view of a modular high density communications chassis of FIG. 1 having a cable management set-up, according to an example embodiment. FIG. 15 is a perspective third view of the modular high density communications chassis of FIG. 1 having a pull-out cable management tray in a stored position, according to an example embodiment. FIG. 16 is a perspective third view of the modular high density communications chassis of FIG. 15 having a pull-out cable management tray in a cable management position, according to an example embodiment. Referring to FIGS. 14 to 16, and referring to FIGS. 1 to 13, in some embodiments, the extension portion 4A of the push-pull tab 4 comprises a cable hook clip 411 configured for cable management, whereby cables are extended therethrough, and the amount of the at least a push-pull tab 4 is two, and the two at least a push-pull tabs 4 is configured such that the cables extending through the cable hook clips 411, respectively, is taut.

In some embodiments, the at least a slidable carrier module 3 further comprises at least a connector adapter mounted therein. When the at least a slidable carrier module 3 is mounted to the chassis 1, at least a connector is mounted to the at least a connector adapter port 91 from the access opening 11 and at least a connector is mounted to the at least a connector adapter port 92 from the access mounting opening 12. In some embodiments, the at least a connector adapter is configured to receive the at least a connector in two positions, whereby each position is different by 180 degrees. In some embodiments, the amount of the at least a connector mounted to the at least a connector adapter configured to receive the at least a connector in two positions is eighteen and the amount of the at least a slidable carrier module 3 is twenty four.

In some embodiments, the chassis 1 further comprises at least a cable clip assembled at the access opening 11, configured for cable management. The connector cables are extended through the at least a cable clip. In some embodiments, the connector cables mounted to the at least a connector adapter of each of the neighboring at least a slidable carrier module 3 are staggeredly mounted, wherein the staggeredly mounted at least a connector mounted to the at least a connector adapter of each of the neighboring at least a slidable carrier module 3 is gathered to flow in opposing directions via the at least a cable clip and cable hook clips.

In some embodiments, the chassis 1 further comprises a pull-out cable management tray 16 assembled to the two opposing side panels 19, 19 of the chassis 1 at the access mounting opening 12. The pull-out cable management tray 16 is longitudinally moveable relative to the chassis 1 and has at least one tray cable clip assembled thereto, configured for cable management, and a stored position and a cable management position. The connector cables are extended through the at least one tray cable clip. When in the stored position, the pull-out cable management tray 16 is parallel to the first panel 14, flush therewith, and the connector cables are arranged such that a first protruding arch-shape R1 is formed by portions of the connector cables extending from at least a second panel cable clip 17 assembled to the second panel 13 at the access mounting opening 12 to the at least one tray cable clip 18. To access or load from the access mounting opening 12 of the chassis 1 a technician may pull-out the cable management tray 16. When in the cable management position, the pull-out cable management tray 16 is perpendicular to the first panel 14, hanging out therefrom, and the cables are stretched such that a smaller portion of the cables is available to form the first protruding arch-shape R1, forming a smaller second protruding arch-shape R2 and the remaining portions of the cables are stretched taut, increasing the spacing between the cables for easier access and management of the communications equipment or cables.

In some embodiments, when the first module track 333 of the at least a slidable carrier module 3 is released from the squeeze-release latching rail mechanism 52 of the at least a sectional sliding mechanism 5, and the at least a slidable carrier module 3 is pushed back toward the access mounting opening 12 for inspection, maintenance and/or repair, as examples, the rear port end 35 or at least a connector adapter port 92 of the at least a slidable carrier module 3 loosens a cable of the at least a connector mounted to the rear port end 35 or at least a connector adapter port 92. At this time, the protruding arch-shape formed by portions of the connector cable extending from at least a second panel cable clip 17 assembled to the second panel 13 at the access mounting opening 12 to the at least one tray cable clip 18 increases. The larger protruding arch-shape increases visibility of the at least a slidable carrier module 3 required for inspection, maintenance and/or repair, thus, making identification easier for technicians, saving time and trouble.

The cable management of the embodiments, for example, the cable hook clip 411 of the push-pull tab 4, at least a cable clip assembled at the access opening 11, at least one tray cable clip assembled to the pull-out cable management tray 16, the pull-out cable management tray 16, and the at least a second panel cable clip assembled to the second panel 13, are configured such that they accommodate any cable slack during the forward and rearward slidable movements of the pull-out cable management tray 16. Also, in the embodiments, the cable hook is hook-shaped; however, the embodiments are not limited thereto. The cable hook may be any suitable hook, dip, or ring, etc. known to those having ordinary skill in the art, as long as cables may be extended therethrough.

The rails and tracks of the modular high density communications chassis of the embodiments may be any suitable rail and track known to those having ordinary skill in the art and may be configured in any suitable manner known to those having ordinary skill in the art. As long as slidable movement and/or a mounting feature is present.

The exploding demand for data volumes and data rates have resulted in existing data centers being upgraded and new data centers begin built. Often, there are multiple adapters and cable segments connected in a data center, with the polarity of the connectors used changing not just when, but, several times during deployment. The problem of poor communications equipment access and cable management during installation, maintenance and repair has increased. Often, there are multiple adapters and cable segments connected in a data center, with access to connectors used required not just when, but, several times during deployment. Access and cable management during installation, maintenance and repair of communications equipment may be time-consuming, increase the risk of human error, and in some instances, require special tools for completion. Further, densely packed connections may exacerbate the problem and result in damaged communications equipment or devices, or signals not being transmitted.

In the embodiments, modular high density communications chassis, comprising a modular high density communications chassis, comprising a chassis and slidable carrier module is provided. The chassis comprises a second track having a first and second stage access fixing recess and a sectional sliding mechanism having a moveable squeeze-release latching rail mechanism. The slidable carrier module comprises a push-pull tab and a snap-fit mechanism, and is slidably mounted to the second track and squeeze-release latching rail mechanism. The slidable carrier module is slidably mounted to the chassis vertically. The snap-fit mechanism is configured to secure and release the slidable carrier module in and from a first stage position when corresponding to the first stage access fixing recess, and in and from a second stage position when corresponding to the second stage access fixing recess, via pulling and pushing of the at least a push-pull tab, respectively, providing staged access to the slidable carrier module and staged management of the connector cables extending to and therefrom.

The embodiments of the modular high density communications chassis allow for cabling infrastructure in data centers, as an example, to be even more reliable, easier to install, modular and flexible, to accommodate changes, data center growth, and increased cable densities in same footprints. When access to communications equipment used is required a simple push-pull tab is employed to extend the slidable carrier module outward for installation, maintenance and repair. The combination of the first and second stage access fixing recesses of the second track of the chassis, and inverted V-cut-out and snap-fit mechanism of the push-pull tab allow two-staged access of the slidable carrier module to a first and second stage position for greater convenience of technicians. The slidable carrier module is pushed and pulled to a desired position. Thus, time is saved, risk of human error is mitigated, and no special tool is required for completion. Via vertical alignment of the slidable carrier module and convenient installation of hooks, clips, or rings to the chassis, cable management of cables extending to and/or from the modular high density communications chassis of the embodiments is simplified, decreasing clutter, and increasing access to connection locations of communications equipment. The pull-out cable management tray at the access mounting opening is employed to stretch the cables from the modular high density communications chassis such that a smaller portion of the cables is available to form the first protruding arch-shape forming a smaller second protruding arch-shape R2 and the remaining portions of the cables are stretched taut, increasing the spacing between the cables for decreased clutter and increased access for technicians.

The presently disclosed inventive concepts are not intended to be limited to the embodiments shown herein, but are to be accorded their full scope consistent with the principles underlying the disclosed concepts herein. Directions and references to an element, such as "up," "down,", "upper," "lower," "horizontal," "vertical," "left," "right," and the like, do not imply absolute relationships, positions, and/or orientations. Terms of an element, such as "first" and "second" are not literal, but, distinguishing terms. As used herein, terms "comprises" or "comprising" encompass the notions of "including" and "having" and specify the presence of elements, operations, and/or groups or combinations thereof and do not imply preclusion of the presence or addition of one or more other elements, operations and/or groups or combinations thereof. Sequence of operations do not imply absoluteness unless specifically so stated. Reference to an element in the singular, such as by use of the article "a" or "an", is not intended to mean "one and only one" unless specifically so stated, but rather "one or more". As used herein "and/or" means "and" or "or", as well as "and" and "or." As used herein, ranges and subranges mean all ranges including whole and/or fractional values therein and language which defines or modifies ranges and subranges, such as "at least," "greater than," "less than," "no more than," and the like, mean subranges and/or an upper or lower limit. All structural and functional equivalents to the elements of the various embodiments described throughout the disclosure that are known or later come to be known to those having ordinary skill in the relevant art are intended to be encompassed by the features described and claimed herein. Moreover, nothing disclosed herein is intended to be dedicated to the public regardless of whether such disclosure may ultimately explicitly be recited in the claims. No element or concept disclosed herein or hereafter presented shall be construed under the provisions of 35 USC 112(f) unless the element or concept is expressly recited using the phrase "means for" or "step for".

In view of the many possible embodiments to which the disclosed principles can be applied, we reserve the right to claim any and all combinations of features and acts described herein, including the right to claim all that comes within the scope and spirit of the foregoing description, as well as the combinations recited, literally and equivalently, in the following claims and any claims presented anytime throughout prosecution of this application or any application claiming benefit of or priority from this application.

What is claimed is:

1. A modular high density communications chassis, comprising:
a chassis configured for receiving communications equipment, defined by a first panel, a second panel, and two opposing side panels, forming an access opening and an access mounting opening, opposite the access opening, and at least a second track positioned on the second panel longitudinal to the two opposing side panels, wherein the at least a second track has a first stage access fixing recess and a second stage access fixing recess, whereby the second stage access fixing recess is closer to the access opening than the first stage access fixing recess; and
at least a slidable carrier module, comprising a second module rail on a top side thereof, at least a push-pull tab having an extension portion extending perpendicularly outwardly from a front plane of the at least a slidable carrier module and an assembly portion, assembled to a side of the at least a slidable carrier module, and a snap-fit mechanism, corresponding to the assembly portion, assembled to the side of the at least a slidable carrier module,
wherein the at least a slidable carrier module is slidably mounted on the at least a second track via the second module rail, and when the at least a slidable carrier module is mounted to the chassis, at least a portion of the extension portion of the push-pull tab extends past a plane of the access opening,
wherein the at least a push-pull tab is configured to move the snap-fit mechanism, and
wherein the snap-fit mechanism is configured to secure and release the at least a slidable carrier module in and from a first stage position when corresponding to the first stage access fixing recess, and in and from a second stage position when corresponding to the second stage access fixing recess, via pulling and pushing of the at least a push-pull tab, respectively.

2. The modular high density communications chassis of claim 1, wherein the chassis further comprises:
at least a sectional sliding mechanism therein, comprising:
a first track positioned on the first panel longitudinal to the two opposing side panels, opposite and corresponding to the at least a second track; and
a squeeze-release latching rail mechanism, slidable to the first track, having a squeeze-release portion, configured to secure and release a first module track on a bottom side of the at least a slidable carrier module thereto,
wherein when the at least a slidable carrier module is mounted to the chassis, the squeeze-release portion extends past a front plane of the at least a slidable carrier module.

3. The modular high density communications chassis of claim 2, wherein the first module track comprises:
a latch receiving portion on a front end thereof, having a front module portion and two module latching shoulders on the front end,
wherein the latch receiving portion is slidably mounted and secured to the squeeze-release latching rail mechanism.

4. The modular high density communications chassis of claim 3, wherein the squeeze-release latching rail mechanism further comprises:
a latching portion integrated next to the squeeze-release portion, having two corresponding side overhangs,
wherein when the latch receiving portion is slidably mounted and secured to the squeeze-release latching rail mechanism, the latching portion is within the front module portion and the two overhangs rest on the two module latching shoulders, and
wherein when releasing the first module track from the squeeze-release latching rail mechanism, the squeeze-release portion is squeezed together to move the two overhangs of the latching portion toward each other at a distance greater than a depth of the two module latching shoulders, and then pulled outwardly away from within the front module portion.

5. The modular high density communications chassis of claim 1, wherein the at least a push-pull tab comprises an inverted V-cut-out near to an opposite end of the at least a portion of the push-pull tab extending past the plane of the opening, at a first side thereof, and is moveable to a securing position and two releasing positions on opposite sides of the securing position, relative to the at least a slidable carrier module.

6. The modular high density communications chassis of claim 5, wherein the snap-fit mechanism comprises:
a snap-fit rod having a protruding end and at least one rod assembly portion, moveably secured and released in and from the first stage access fixing recess and second stage access fixing recess via the protruding end, respectively;
at least a snap-fit rod member integrally formed on the at least one rod assembly portion having a pressure end and a contact end, opposite the pressure end; and
a spring member in constant contact with the pressure end of the at least a snap-fit rod member,
wherein when the at least a push-pull tab is in the securing position, the contact end of the at least a snap-fit rod member is in contact with an inner recess of the inverted V-cut-out and when the at least a push-pull tab is in the releasing positions, the contact end of the at least a snap-fit rod member is in contact with either ends of the inverted V-cut-out.

7. The modular high density communications chassis of claim 1, wherein the chassis further comprises at least one supporting structure, slidably mounted therein, in contact with the first and second panels and parallel to the two opposing side panels.

8. The modular high density communications chassis of claim 1, wherein the at least a slidable carrier module is slidably mounted to the chassis vertically, longitudinal to the two opposing side panels.

9. The modular high density communications chassis of claim 1, wherein the amount of the at least a slidable carrier module is two or greater.

10. The modular high density communications chassis of claim 1, wherein the extension portion of the push-pull tab comprises a cable hook clip configured for cable management, whereby cables are extended therethrough.

11. The modular high density communications chassis of claim 1, wherein the amount of the at least a push-pull tab is two.

12. The modular high density communications chassis of claim 10, wherein the amount of the at least a push-pull tab is two, and the two at least a push-pull tabs is configured such that the cables extending through the cable hook clips, respectively, is taut.

13. The modular high density communications chassis of claim 12, wherein the at least a slidable carrier module further comprises at least a connector adapter mounted therein, wherein when the at least a slidable carrier module is mounted to the chassis, at least a connector is mounted to the at least a connector adapter from, the access opening and at least a connector is mounted to the at least a connector adapter from the access mounting opening.

14. The modular high density communications chassis of claim 13, wherein the amount of the at least a connector mounted to the at least a connector adapter is eighteen and the amount of the at least a slidable carrier module is twenty four.

15. The modular high density communications chassis of claim 13, wherein the at least a connector adapter is configured to receive the at least a connector in two positions, whereby each position is different by 180 degrees.

16. The modular high density communications chassis of claim 15, wherein the amount of the at least a connector mounted to the at least a connector adapter configured to receive the at least a connector in two positions is eighteen and the amount of the at least a slidable carrier module is twenty four.

17. The modular high density communications chassis of claim 14, wherein the chassis further comprises at least a cable clip assembled at the access opening, configured for cable management, whereby connector cables are extended therethrough, and wherein the connector cables mounted to the at least a connector adapter of each of the neighboring at least a slidable carrier module are staggeredly mounted, and wherein the staggeredly mounted at least a connector mounted to the at least a connector adapter of each of the neighboring at least a slidable carrier module is gathered to flow in opposing directions via the at least a cable clip and cable hook clips.

18. The modular high density communications chassis of claim 16, wherein the chassis further comprises at least a cable clip assembled at the access opening, configured for cable management, whereby connector cables are extended therethrough, and wherein the connector cables mounted to the at least a connector adapter of each of the neighboring at least a slidable carrier module are staggeredly mounted, and wherein the staggeredly mounted at least a connector mounted to the at least a connector adapter of each of the neighboring at least a slidable carrier module is gathered to flow in opposing directions via the at least a cable clip and cable hook clips.

19. The modular high density communications chassis of claim 14, wherein the chassis further comprises a pull-out cable management tray assembled to the two opposing side panels of the chassis at the access mounting opening, longitudinally moveable therewith, having at least one tray cable clip assembled thereto, configured for cable management, whereby connector cables are extended therethrough, and a stored position and a cable management position, wherein when in the stored position, the pull-out cable management tray is parallel to the first panel, flush therewith, and the connector cables are arranged such that a first protruding arch-shape is formed by portions of the connector cables extending from at least a second panel cable clip assembled to the second panel at the access mounting opening to the at least one tray cable clip, and when in the cable management position, the pull-out cable management tray is perpendicular to the first panel, hanging out therefrom, and the cables are stretched such that a smaller portion of the cables is available to form the first protruding arch-shape, forming a smaller second protruding arch-shape and the remaining portions of the cables are stretched taut, increasing the spacing between the cables.

20. The modular high density communications chassis of claim 16, wherein the chassis further comprises a pull-out cable management tray assembled to the two opposing side panels of the chassis at the access mounting opening, longitudinally moveable therewith, having at least one tray cable clip assembled thereto, configured for cable management, whereby connector cables are extended therethrough, and a stored position and a cable management position, wherein when in the stored position, the pull-out cable management tray is parallel to the first panel, flush therewith, and the connector cables are arranged such that a first protruding arch-shape is formed by portions of the connector cables extending from at least a second panel cable clip assembled to the second panel at the access mounting opening to the at least one tray cable clip, and when in the cable management position, the pull-out cable management tray is perpendicular to the first panel, hanging out therefrom, and the cables are stretched such that a smaller portion of the cables is available to form the first protruding arch-shape, forming a smaller second protruding arch-shape and the remaining portions of the cables are stretched taut, increasing the spacing between the cables.

* * * * *